(12) United States Patent
Hsieh et al.

(10) Patent No.: US 6,638,879 B2
(45) Date of Patent: Oct. 28, 2003

(54) METHOD FOR FORMING NITRIDE SPACER BY USING ATOMIC LAYER DEPOSITION

(75) Inventors: Jung-Yu Hsieh, Hsin-Chu (TW); Chin-Hsiang Lin, Nan-Tao (TW)

(73) Assignee: Macronix International Co., Ltd., Hsin-Chu (TW)

(*) Notice: Subject to any disclaimer, the term of this patent is extended or adjusted under 35 U.S.C. 154(b) by 28 days.

(21) Appl. No.: 10/003,317

(22) Filed: Dec. 6, 2001

(65) Prior Publication Data

US 2003/0109107 A1 Jun. 12, 2003

(51) Int. Cl.$^7$ .............................................. H01L 21/477
(52) U.S. Cl. ........................................ 438/791; 438/775
(58) Field of Search ................................ 438/595, 761, 438/775, 791

(56) References Cited

U.S. PATENT DOCUMENTS 6,440,860 B1 * 8/2002 DeBoer et al. ............. 438/703
6,455,389 B1 * 9/2002 Huang et al. ............... 438/305

* cited by examiner

*Primary Examiner*—Amir Zarabian
*Assistant Examiner*—Pamela E Perkins

(57) ABSTRACT

The present invention provides a method for forming a silicon nitride spacer by using an atomic layer deposition (ALD) method. The procedure of the ALD is to use a first kind of excess gas as a reactant air and thus produce a first mono-layer solid phase of the first reactant air on the wafer. When the first chemical reaction is completed, the first excess air is drawn out, and then the second excess air is released to deposit a second mono-layer solid phase of the second reactant air on the first mono-layer solid phase. In this way, a whole deposited layer with a layer of the first mono-layer solid phase, a layer of the second mono-layer solid phase, and so on are stepwise formed on the wafer surface. The ALD method is a time consuming task in deposition process such as in the generation of 0.35 $\mu$m to 0.5 $\mu$m of VLSI ages. However, in the generation of 0.18 $\mu$m, 0.13 $\mu$m or beyond of VLSI ages, because the device is getting smaller than ever before, the deposition speed of the ALD method is just right on time to meet the demand and is an appropriate method in depositing silicon nitride spacer.

16 Claims, 6 Drawing Sheets

METHOD FOR FORMING NITRIDE SPACER BY USING ATOMIC LAYER DEPOSITION

BACKGROUND OF THE INVENTION

1. Field of the Invention

The present invention generally relates to a method for forming a silicon nitride spacer, and in particular to a method for forming a silicon nitride spacer by atomic layer deposition.

2. Description of the Prior Art

In conventional very large semiconductor integrated circuit (VLSI) process, silicon nitride ($Si_3N_4$) is a widely used dielectric material in integrated circuit (IC) fabrication process. It is usually used as a spacer to serve as an etching mask of $SiO_2$. Because of the advantageous characteristic of not being penetrated by oxygen, silicon nitride can also be used as a mask layer for preventing the active area from oxidation.

The LPCVD (low pressure chemical vapor deposition) is a deposition method in depositing the silicon nitride film. Traditional LPCVD process for forming silicon nitride is shown in FIG. 1A to FIG. 1D.

In FIG. 1A, first providing a MOS (metal oxide semiconductor) structure with a p-type substrate 201, a gate structure consisting of a poly layer 203 and SiO2 dielectric layer 205, a field oxidation (FOX) layer 209, and a p+ type channel stop layer 211 beneath the field oxidation layer 209, are stepwise formed on the surface of a wafer. Then, in the next step, using the gate as a mask, a lightly doped drain (LDD) of ion implantation of $Br^-$ 213 is carried out using the gate as a mask to implant under beneath the rest area of the wafer except gate and field oxidation region 209.

In FIG. 1B, the wafer is sent to furnace by LPCVD method to form a silicon nitride layer, the formation of silicon nitride layer is usually conducted at a high temperature of about 700 to 800° C.

In the LPCVD process, as shown in FIG. 2, there are two kinds of gases involve in the deposition process, the first gate could be silane or dichlorosilane ($SiH_2Cl_2$) 217, and the other gas is ammonia ($NH_3$) 219. The standard procedure for LPCVD is to use dichlorosilane or silane 217 and ammonia 219 together as the reactant gases. When the reaction begins, an ideal stoichiometry solid phase product of silicon nitride film 213 is deposited on the wafer.

Returning to FIG. 1C, a layer of silicon nitride 203 is globally formed on the wafer through the chemical reaction of silane or dichlorosilane and ammonia gas by LPCVD.

In FIG. 1D, partially etching and removing the silicon nitride layer 223 thus forming a silicon nitride spacer 223A near the gate.

During the LPCVD process, however, due to various different pattern density of circuit distribution on the wafer as shown in FIG. 3. There is an isolated region 301 and a dense region 303 co-exists on the wafer surface. Normally, the memory array lie on the isolated regions 301 and the peripheral circuits lie on the dense regions 303. When LPCVD process is conducted, the flow of the reactant gases (include dichlorosilane and ammonia or silane and ammonia) will run through the isolated and dense regions of the wafer surface. It is easily understood that the depth of the deposited film on the wafer surface largely varies with the reactant flows that run through the different density distribution area because of diffusion loading effect.

The deposited film of silicon nitride in the dense region is thinner than that of the isolated region due to the diffusion effect of the reactant flow. Ii also shows that the deposition depth on the sidewall area is thinner than the deposition depth of the rest areas. This effect makes an inhomogeneous coverage of the deposited silicon nitride distribution. This inhomogeneous coverage could result a bas consequence in the future fabrication process.

Another defect associated with LPCVD method is the high temperature thermal process involved in the chemical reaction. Because the high temperature thermal process will force $Br^-$ ion to penetrate into a deeper depth of the gate oxidation layer, thus making a leakage current occur in the gate oxide regions.

The other defect of LPCVD is the crack phenomena that occur when Si3N4 is deposited. If the deposited depth of the Si3N4 film is too thick, the tensile stress imbalance results a crack in the structure of the silicon nitride film.

In light of the foregoing, there is a need in the art for an improved process.

SUMMARY OF THE INVENTION

In accordance with the present invention, a method is provided for forming a silicon nitride spacer by atomic layer deposition that substantially prevents the defect such as inhomogeneous coverage of silicon nitride film, silicon nitride crack, and leakage current problem associated with the conventional LPCVD method (low pressure chemical vapor deposition method).

It is an object of this invention to provide a method for forming a silicon nitride spacer.

It is another object of this invention to provide a method for forming a silicon nitride spacer without the defects of crack, leakage current, and high temperature problems.

According to the foregoing objects, the present invention provides a method for forming a silicon nitride spacer by using atomic layer deposition method (ALD).

In this invention, the ALD (atomic layer deposition) method is applied to the formation of a silicon nitride spacer. It shows, first providing a first excess gas of A(g), for example, silane ($SiH_4$) gas is introduced onto the substrate surface and produce a chemical reaction of a first mono solid phase layer A(s), for example, solid silicon (Si) deposited on the wafer surface. After the completion of the first chemical reaction to produce the first mono solid phase layer A(s), the first excess gas of A(g) is drawn out from the furnace. Then, another second gas of B(g), for example, ammonia gas is introduced onto the surface of the first mono solid phase layer A(s), for example, nitride and produce a chemical reaction of the second mono solid phase layer B(s) on the surface of the first mono solid phase layer A(s). After the completion of the second chemical reaction to produce a second mono solid phase layer B(s), the second excess gas of B(g) is drawn out from the furnace. Then, repeat this fabrication cycle, a layer of A(s), B(s), and A(s), B(s) are stepwise covered on the surface of the wafer thus gradually forming silicon nitride layer. This kind of the process is to introduce one kind of air to produce one deposition layer is sequentially. The surface chemical reaction ends automatically as long as the reaction is completed. It is to be mentioned here that during the chemical reactions, the extra excess air of each releasing air would do no further contribution in the formation of the deposited solid phase products as long as the reaction of the solid phase deposition is completed. So, there will be no inhomogeneous coverage result in ALD method.

Although the depositing task of ALD is a time consuming task in the VLSI generation of 0.35 or 0.5 $\mu$m, however, in the present generation of 0.13, 0.18 µm or beyond. The associated devices are getting smaller than ever before, the ALD deposition is just right time to meet the demand of the device reducing size of VLSI ages.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a schematic representation showing the isolated and dense regions on the circuit distribution when the reactant flows run through;

DESCRIPTION OF THE PREFERRED EMBODIMENT

Figure 1A:
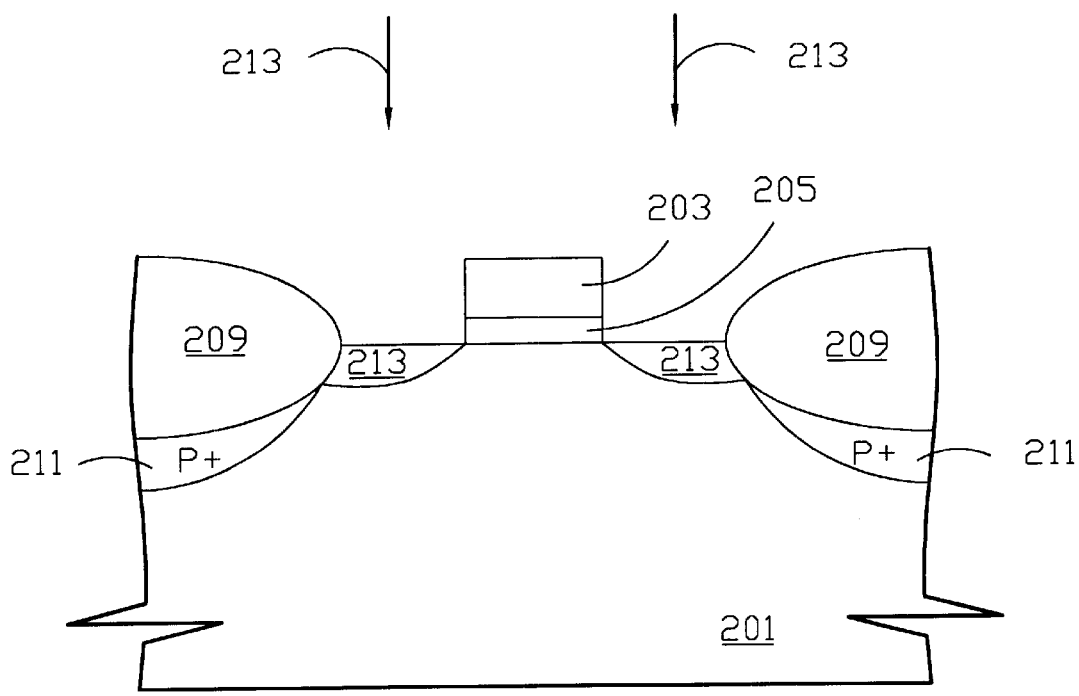
FIGS. 1A to 1D are the diagrams showing the traditional LPCVD (low pressure chemical vapor deposition) fabrication method for forming a silicon nitride spacer.
Figure 1B:
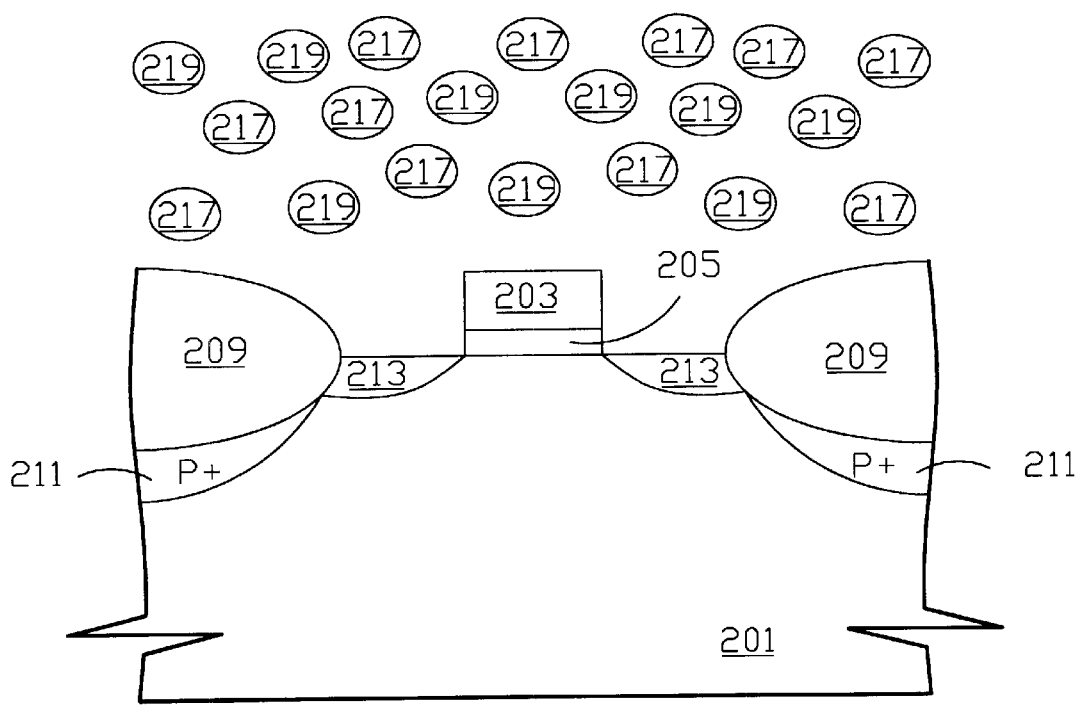
Figure 1C:
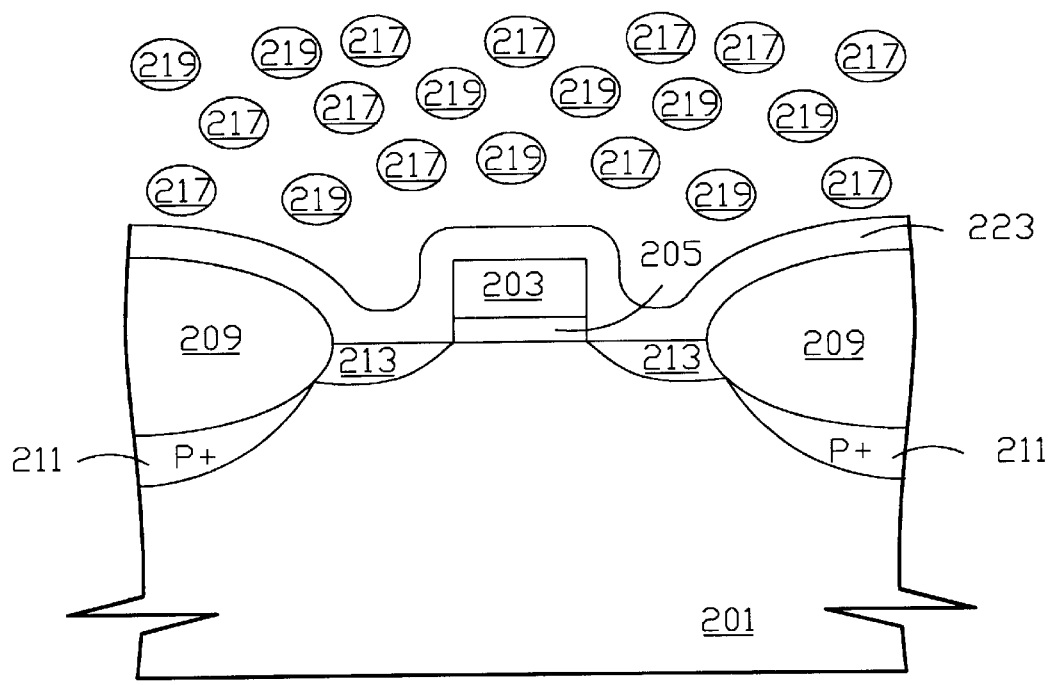
Figure 1D:
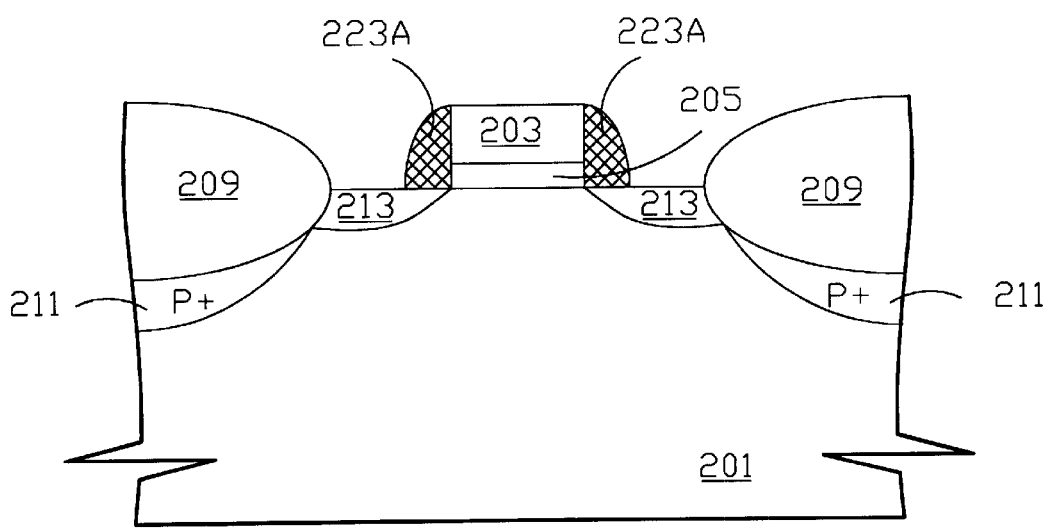
Figure 2:
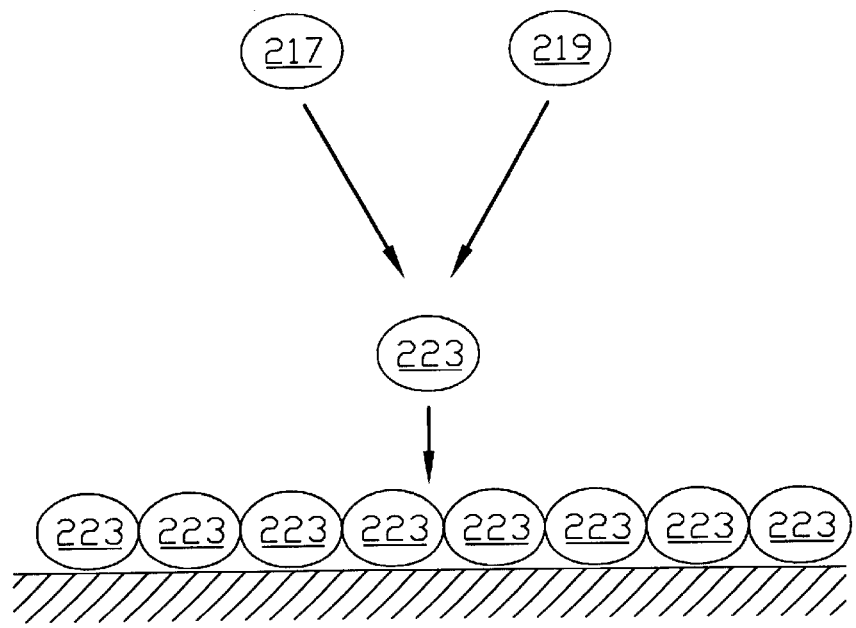
FIG. 2 is a diagram showing the traditional LPCVD fabrication method with two kinds of reactant gases in the chemical reaction to produce silicon nitride layer.
Figure 3:
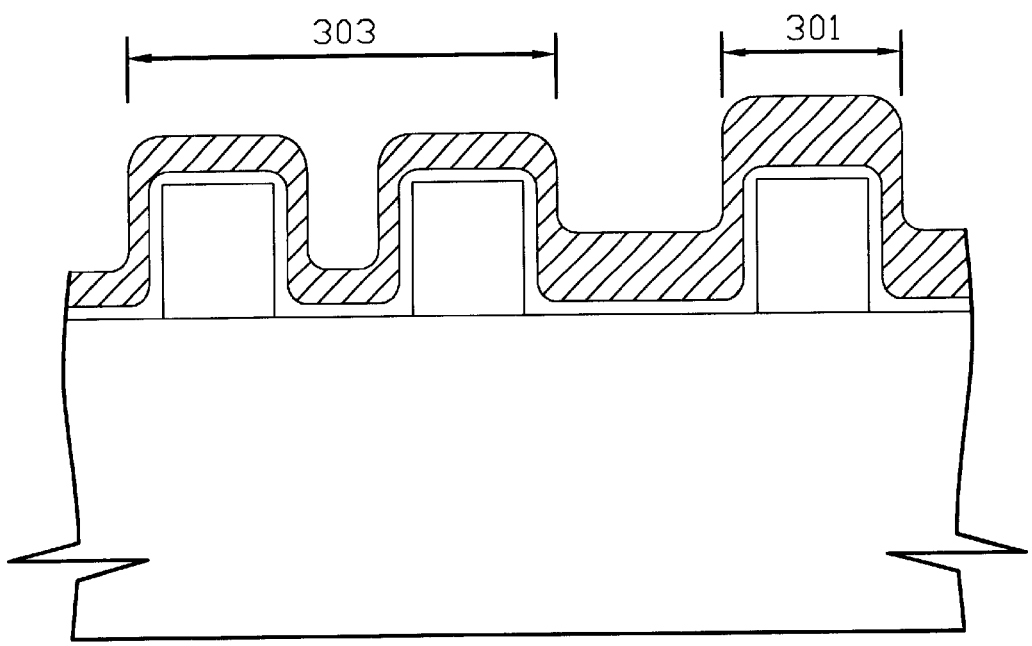

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

The preferred embodiment of the invention will now be described in great detail. Nevertheless, it should be recognized that the present invention can be practiced in a wide range of other embodiments besides those explicitly described, and the scope of the present invention expressed is not limited except as specified in the accompanying claims.

Moreover, while the present invention is illustrated by a number of preferred embodiments directed to silicon semiconductor devices, it is not intended that these illustrations be a limitation on the scope or applicability devices of the present invention be limited to the structure illustrated. These devices are included to demonstrate the utility and application of the present invention to the present preferred embodiments.

Furthermore, various parts of the semiconductor elements have not been drawn to scale. Certain dimensions have been exaggerated in relation to other dimensions in order to provide a clearer illustration and understanding of the present invention. For example, although the embodiments illustrated herein are shown in two dimensional prospect of vies with various regions having width and depth. It should be clearly understood that these regions are illustrations of only a portion of a single cell of a device which may include a plurality of such cells arranged in a three dimensional structure. Accordingly, these regions will include three dimensions, including length, width, and depth, when fabricated in a actual device.

Although atomic layer deposition techniques is a widely used method yet there is no disclosure relating to the formation of silicon nitride spacer by atomic layer deposition method. The reason for this is due to the time required for deposition by atomic layer deposition is too long to deposit the ideal depth of silicon nitride. However, in the VLSI age of 0.13 µm or 0.18 µm generations or above, the device is getting smaller in its scale and the depth of ALD method is respectively reducing its scale, so atomic layer deposition is just right on time to meet the demand.

The second reason for using atomic layer deposition is due to significant problems associated with the use of nitride in conventional LPCVD method. Because in the LPCVD, use of metal nitride containing precursor and reduce incorporation of reactants into the film and difficulty in reproducibility of film stoichiometry, thickness and uniformity across the wafer and contamination of delivery lines. For example to form a nitride film, it is necessary to introduce a gas containing nitrogen reagent such as ammonia into the gas stream. Ammonia can react with the metal nitride precursor in the gas phase leading to premature decomposition in the gas phase and poor growth properties. So, use of nitride in a conventional LPCVD method has a significant problem that may prevent success.

Atomic layer deposition differs from LPCVD method. ALD is performed in a cyclic fashion with sequential alternating pulses of precursor, reactant and purge gas. The ALD precursor must have a self-limiting effect such that the precursor is adsorbed on the substrate up to a mono-layer. Because of the self-limiting effect, only one mono-layer or sub-mono layer is deposited per operation cycles, and additional precursor will not be deposited on the frown layer even when excess precursor is supplied. In LPCVD, precursor and reactants arrive at the substrate simultaneously with film growth resulting from continuous chemical reactions of precursors on the substrate surface. In LPCVD, uniform and reproducible growth of the film is dependent on the maintenance of the correct precursor and reactant flow at the substrate. The growth rate is proportional to the precursor flux at the substrate and to the substrate temperature. However, in ALD, the precursor must readily adsorb at bonding sites on the growth surface in a self-limiting mode, and once adsorbed must readily react with co-reactant to form the desired film.

ALD has some other advantages such as atomically abrupt interfaces, fine thickness control, and excellent uniformity.

Figure 4:
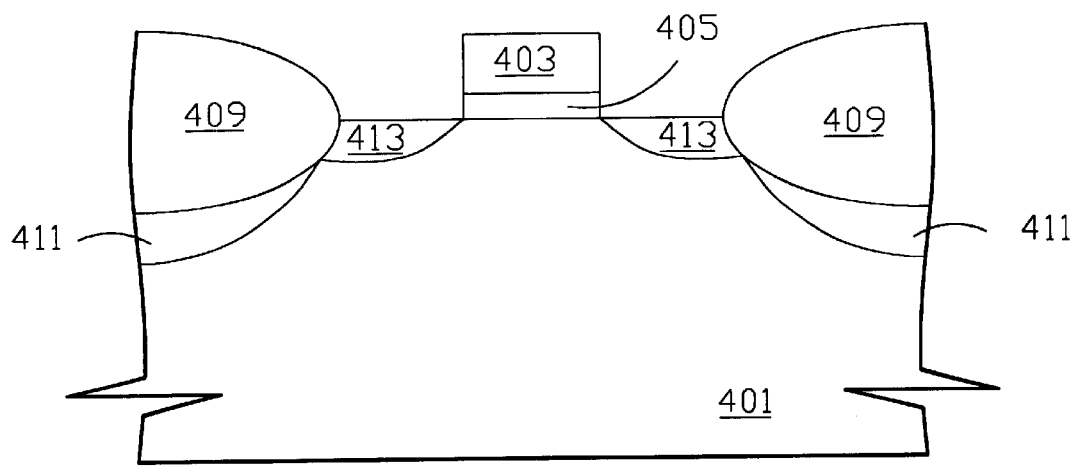
FIG. 4 is a diagram showing the structure of a wafer.

In FIG. 4, first providing a MOS (metal oxide semiconductor) structure with a p-type substrate 401, a gate structure consisting of a poly layer 403 and SiO2 dielectric layer 405, a FOX (field oxide layer) 409, and a $p^+$ type channel stop layer 411 beneath the FOX 409, are stepwise formed on the surface of a wafer. Then using the gate as a mask, a lightly doped drain (LDD) of ion implantation of $Br^-$ ion 413 gas is carried out using the gate as a mask to implant under beneath the rest area of the wafer except gate and FOX 409.

In the next step, the wafer is sent to furnace by ALD method to form a silicon nitride layer. The formation of silicon nitride layer is conducted at a low temperature (as compared to LPCVD method) of about 300 to 350° C.; the range of temperature is thus benefit to the thermal budget during the fabrication process.

Figure 5A:
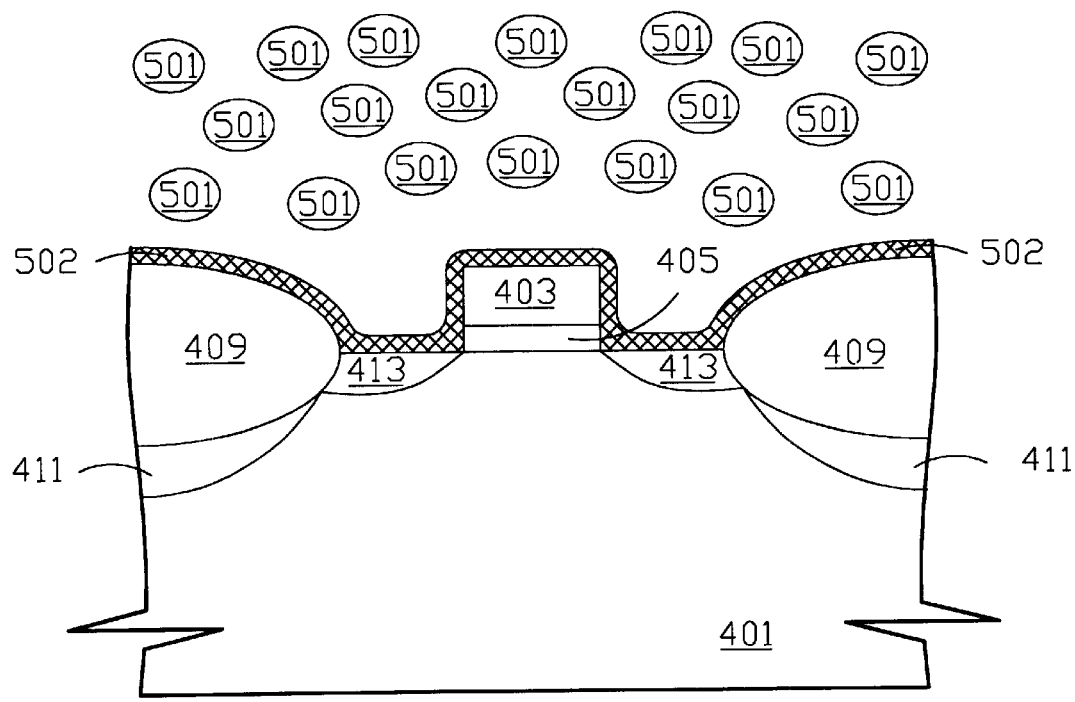
FIG. 5A to FIG. 5C are the diagrams showing the ALD (atomic layer deposition) fabrication method for forming a silicon nitride spacer in the invention.
Figure 5B:
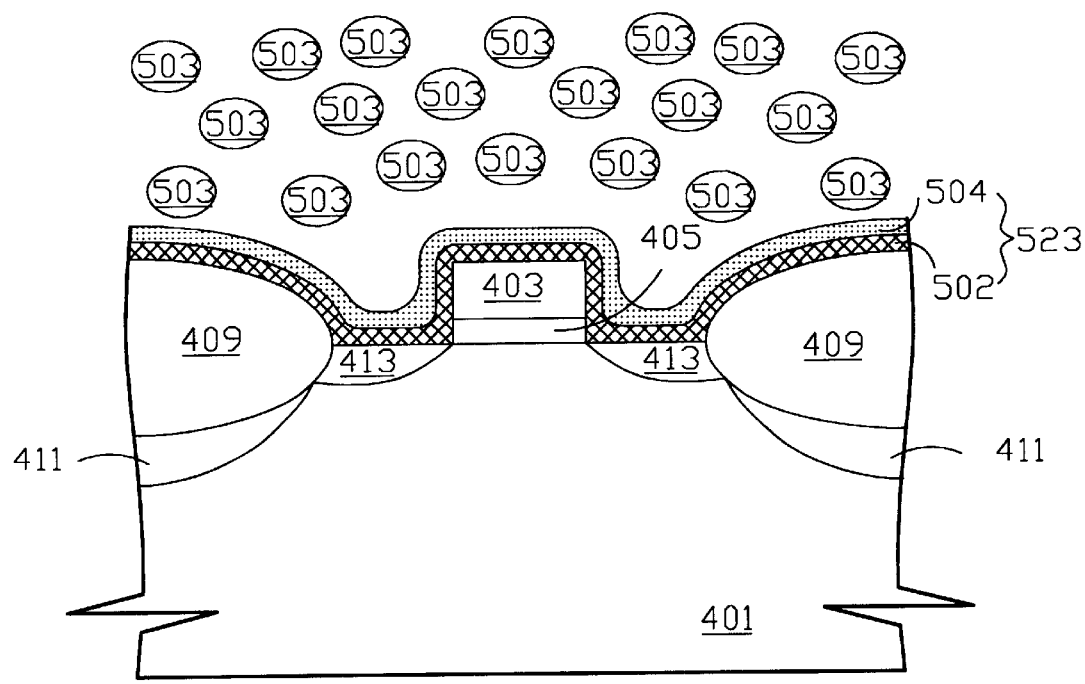

In the ALD process, as shown in FIG. 5A, the chemical reaction is conducted as follows: a first excess gas of silane or dichlorosilane 501 is released from the valve and a first reaction occurs to produce a first solid phase mono-layer 502 on the wafer. Then, after the first reaction, the first excess gas 501 would do no further contribution to the formation of the first mono-layer solid phase 502, then the valve of the first excess gas of silane or dichlorosilane 501 is drawn out. Then, in FIG. 5B, a second reaction occurs to produce a second solid phase mono-layer of nitride 504 on the first mono-layer of solid phase 502. Then, after the second reaction, the second excess gases 503 would do no further contribution to the formation of the second mono-layer solid phase 504, then, the valve of the second excess gas, ammonia 503, is stopped and the gas is drawn out. In this invention, for example, a mono-layer solid phase of silicon and a mono-layer of solid phase of nitride and so on are stepwise formed on the surface of the wafer. In this way, a silicon nitride layer 523 with a combination of a mono-layer of silicon 502 and a mono-layer of nitride 504 and so on are mono-layer of nitride are heated in a thermal annealing process to form a silicon nitride layer on the wafer.

Figure 6:
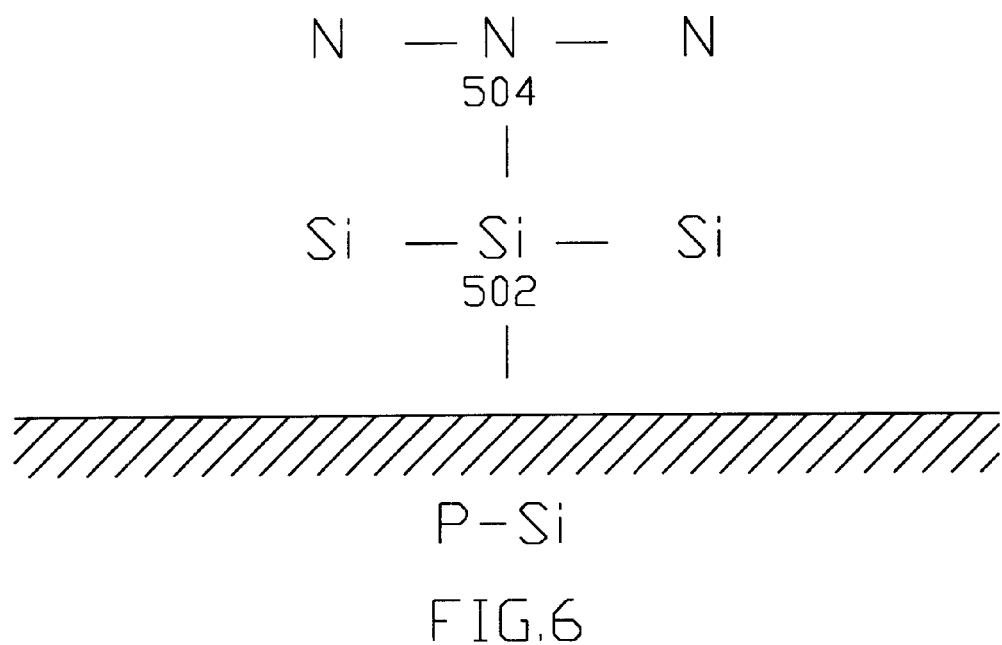
FIG. 6 is a diagram showing the chemical reaction during ALD fabrication method to form the solid mono-layers in sequentially.

In FIG. 6, it shows that during the ALD process, the nitride contained precursor 504 and the silicon contained precursor 502 are deposited on the wafer in sequentially. As the solid phase product formation is completed, the excess gas would do no further contribution to the formation of the solid phase.

Figure 5C:
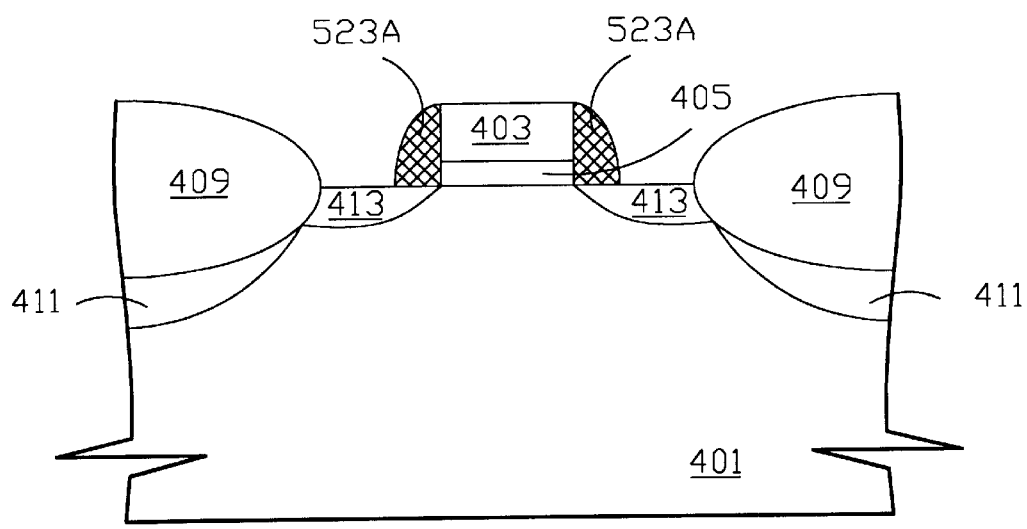

Returning to FIG. 5C, partially etching and removing the silicon nitride layer 523 (include silicon contained precursor 502 and nitride contained precursor 504), thus forming a silicon nitride spacer 523A near the gate.

The result of ALD process can make prefect step coverage of silicon nitride layer on the wafer. Because the procedure is to deposit a mono-layer after another mono-layer, so there is no inhomogeneous coverage of silicon nitride layer associated with dense or isolated regions due to different patterning distribution.

Moreover, while the present invention is illustrated by a number of a preferred embodiment directed to silicon semiconductor devices, it is not intended that these illustrations be a limitation on the scope or applicability of the present invention. Thus, it is not intended that the semiconductor devices of the present invention be limited to the structure illustrated. These devices are included to demonstrate the utility and application of the present invention to presently preferred embodiments.

Although specific embodiments have been illustrated and described, it will be obvious to those skilled in the art that various modifications may be made without departing from what is intended to be limited solely by the appended claims.

What is claimed is:

1. A method for forming a spacer, said method comprising:
   providing a substrate having a gate electrode thereon;
   forming a silicon mono-layer on a surface of said substrate, and a nitride mono-layer on a surface of said silicon mono-layer by using an atomic layer deposition method;
   forming a silicon nitride layer mono-layer on said substrate by repeating said silicon mono-layer and said nitride mono-layer; and
   etching said silicon nitride layer to form a spacer on sidewall of said gate electrode.

2. The method according to claim 1, wherein said forming said silicon mono-layer on said surface of said substrate comprises a step of introducing a gas containing a silane group to said surface of said substrate.

3. The method according to claim 2, wherein said gas containing said silane group comprises silane.

4. The method according to claim 2, wherein said gas containing said silane group comprises dichlorosilane.

5. The method according to claim 2, wherein said step of forming said conformal silicon nitride layer is performed by repeating said silicon mono-layer and said nitride mono-layer.

6. The method according to claim 2, wherein said gas containing said nitrogen comprises ammonia.

7. The method according to claim 1, wherein said forming said nitride mono-layer on said surface of said silicon mono-layer comprises a step of introducing a gas containing a nitrogen to said surface of said silicon mono-layer.

8. A method for forming silicon nitride spacer, said method comprising steps of:
   providing a substrate having a gate electrode thereon;
   introducing a gas containing a silane group to a surface of said substrate;
   forming a silicon mono-layer on said surface of said substrate;
   introducing a gas containing a nitrogen to a surface of said silicon mono-layer;
   forming a nitride mono-layer on said surface of said silicon mono-layer;
   forming a conformal silicon nitride mono-layer and said substrate by repeating said silicon mono-layer and said nitride mono-layer; and
   etching said silicon nitride layer to form a spacer on sidewall of said gate electrode.

9. The method according to claim 8, wherein said gas containing said silane group comprises silane.

10. The method according to claim 8, wherein said gas containing said silane group comprises dichlorosilane.

11. The method according to claim 8, wherein said gas containing said nitrogen comprises ammonia.

12. The method according to claim 8, further comprising a step of repeating said step of introducing said gas containing said silane group to said step of forming said nitride mono-layer in said step of forming said conformal silicon nitride layer.

13. A method for forming silicon nitride spacer, said method comprising:
   providing a substrate having a gate electrode thereon;
   introducing a gas containing a silane group to a surface of said substrate;
   forming a silicon mono-layer on said surface of said substrate;
   introducing a gas containing a nitrogen to a surface of said silicon mono-layer;
   forming a nitride mono-layer on said surface of said silicon mono-layer;
   repeating said step of introducing said gas containing said silane group to said step of forming said nitride mono-layer;
   forming a conformal silicon nitride layer on said substrate by repeating said silicon mono-layer and said nitride mono-layer; and
   etching said silicon nitride layer to form a spacer on sidewall of said gate electrode.

14. The method according to claim 13, wherein said gas containing said silane group comprises silane.

15. The method according to claim 13, wherein said gas containing said silane group comprises dichlorosilane.

16. The method according to claim 13, wherein said gas containing said nitrogen comprises ammonia.

* * * * *